(12) United States Patent
Berger et al.

(10) Patent No.: US 6,878,297 B1
(45) Date of Patent: Apr. 12, 2005

(54) METHOD OF PRODUCING ORGANIC LIGHT-EMISSIVE DEVICES

(75) Inventors: Paul R. Berger, Columbus, OH (US); Stephen Karl Heeks, Cottenham (GB)

(73) Assignee: Cambridge Display Technology, Limited, Cambridge (GB)

(*) Notice: Subject to any disclaimer, the term of this patent is extended or adjusted under 35 U.S.C. 154(b) by 281 days.

(21) Appl. No.: 10/009,078

(22) PCT Filed: Jun. 1, 2000

(86) PCT No.: PCT/GB00/01991

§ 371 (c)(1),
(2), (4) Date: Jun. 19, 2002

(87) PCT Pub. No.: WO00/76008

PCT Pub. Date: Dec. 14, 2000

(30) Foreign Application Priority Data

Jun. 9, 1999 (GB) .............................. 9913451
Jun. 11, 1999 (GB) .............................. 9913695

(51) Int. Cl.⁷ .............................................. H01B 13/00
(52) U.S. Cl. .............................. 216/17; 216/18; 216/19; 438/706
(58) Field of Search .............................. 216/17, 18, 19, 216/58, 67; 438/706, 710, 712, 720

(56) References Cited

U.S. PATENT DOCUMENTS

| 5,201,268 A | 4/1993 | Yamamoto et al. .......... 101/170 |
| 5,340,619 A | 8/1994 | Chen et al. .................. 424/498 |
| 6,063,527 A | * 5/2000 | Nishikawa et al. .......... 430/7 |
| 6,159,779 A | * 12/2000 | Huang et al. ................ 438/158 |

FOREIGN PATENT DOCUMENTS

| EP | 0 734 078 A2 | 9/1996 |
| EP | 0 880 303 A1 | 11/1998 |
| EP | 0 982 974 A1 | 3/2000 |
| GB | 2297647 | 8/1996 |
| JP | 53-113730 | 10/1978 |
| WO | WO 99/12395 | 3/1999 |
| WO | WO 00/04593 | 1/2000 |
| WO | WO 00/60612 | 10/2000 |

OTHER PUBLICATIONS

Search Report from Great Britain Patent Office for Application No. GB 9913695.4 dated Sep. 14, 1999.

International Search Report in PCT/GB00/01991 dated Aug. 4, 2000.

International Preliminary Examination Report in PCT/GB00/01991 dated Sep. 17, 2001.

* cited by examiner

Primary Examiner—Lan Vinh
(74) Attorney, Agent, or Firm—Marshall, Gerstein & Borun LLP

(57) ABSTRACT

A method for forming a patterned layer of a light-emissive material on a substrate, comprising the steps of providing a holed layer on the surface of the substrate, the holed layer being permanently attached to the substrate and defining a plurality of holes through which the underlying substrate is exposed, and applying a light-emissive material to the surface of the holed layer opposite the substrate and displacing the light-emissive material in fluid form across the surface of the holed layer so as to selectively deposit the material only in the holes of the holed layer.

18 Claims, 5 Drawing Sheets

METHOD OF PRODUCING ORGANIC LIGHT-EMISSIVE DEVICES

Figure 1A:
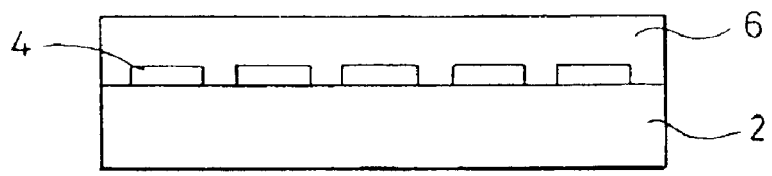
Figure 1B:
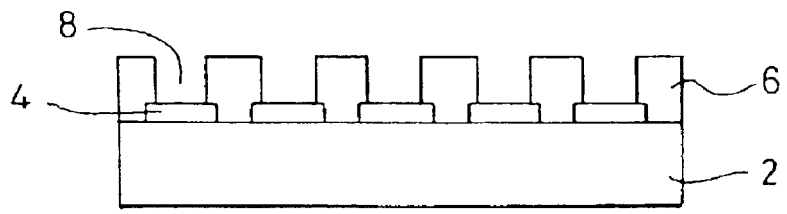
Figure 1C:
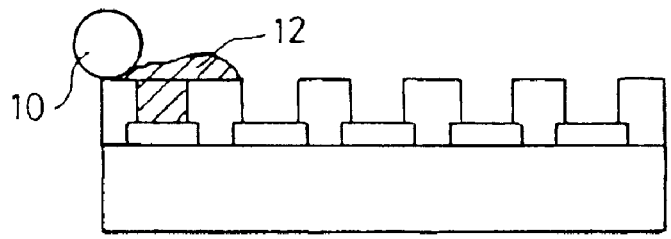
Figure 1D:
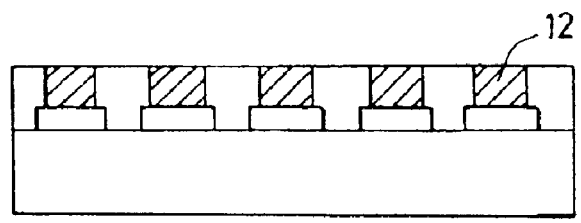
Figure 1E:
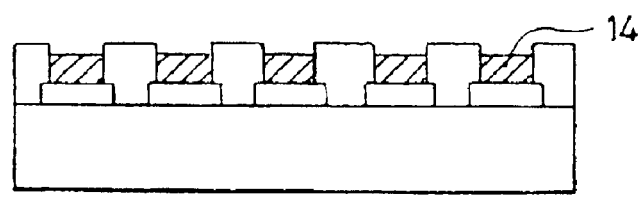
Figure 1F:
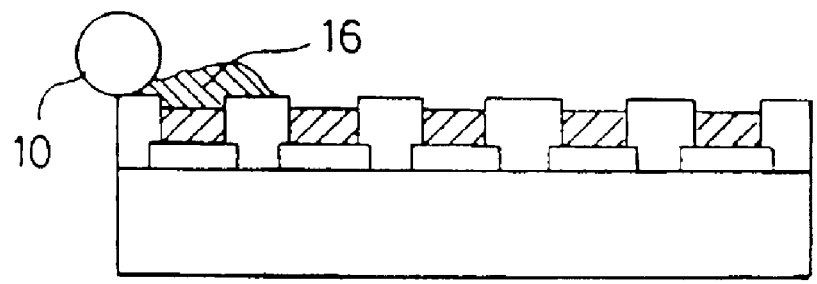
Figure 1G:
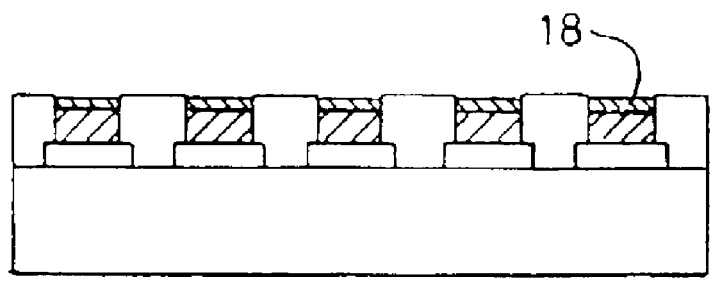
Figure 1H:
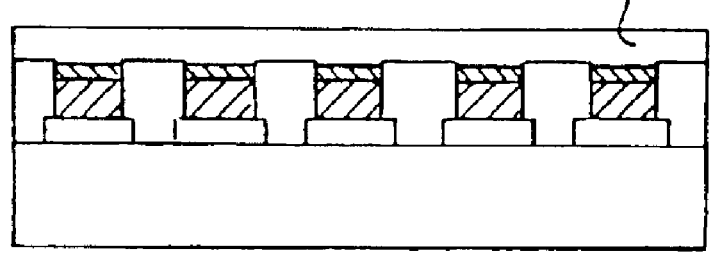
Figure 2A:
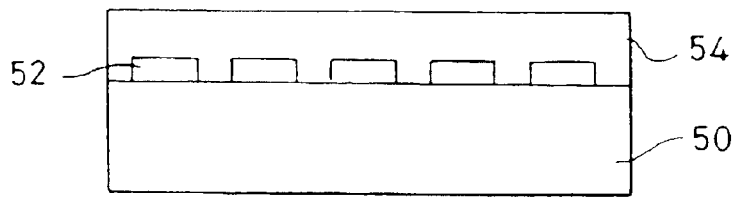
Figure 2B:
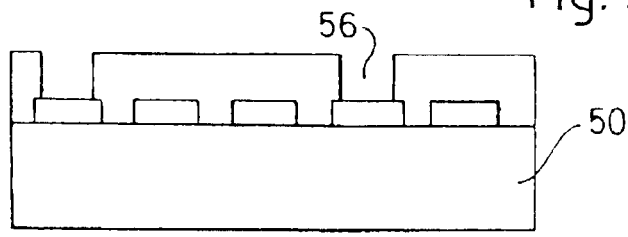
Figure 2C:
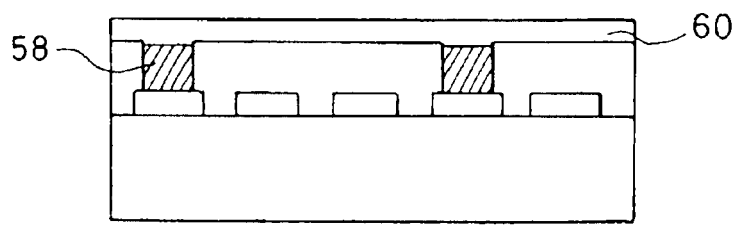
Figure 2D:
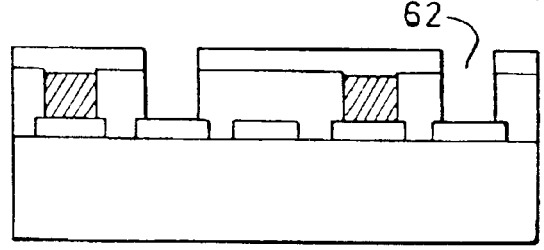
Figure 2E:
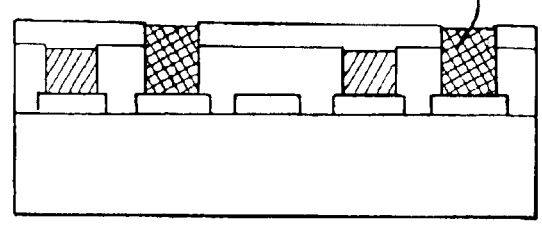
Figure 2F:
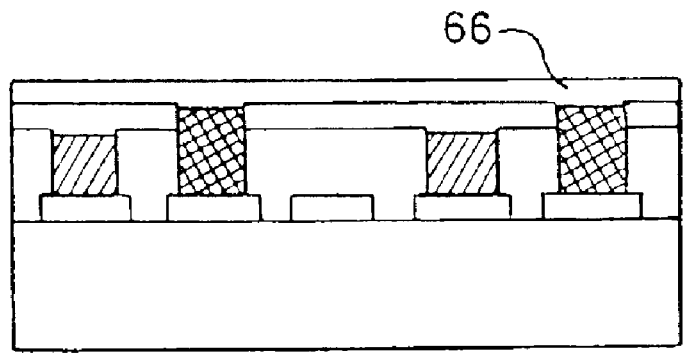
Figure 2G:
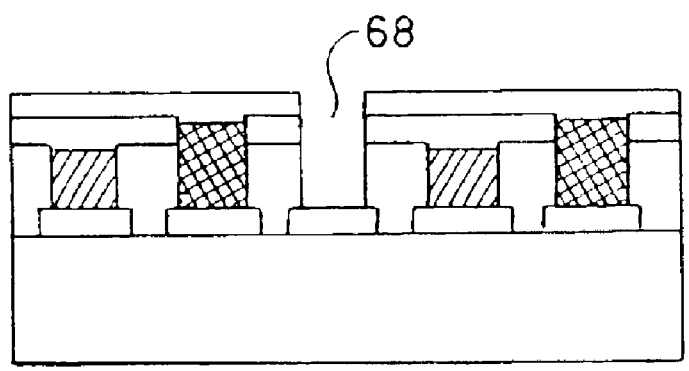
Figure 2H:
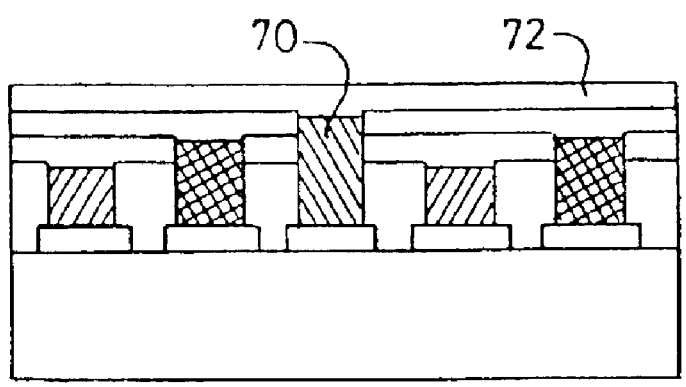

This is the U.S. national phase of International Application No. PCT/GB00/01991 filed Jun. 1, 2000, the entire disclosure of which is incorporated herein by reference.

The present invention relates to a method for producing optoelectronic devices, in particular, organic light-emissive devices (OLEDs).

Organic light-emissive devices typically comprise an organic light-emissive region sandwiched between two electrodes such that charge carriers can move between the organic light-emissive region and the two electrodes.

In many applications such as active matrix displays, at least one of the electrodes and the light-emissive region is required to be patterned into an ordered array of discrete pixels whereby each pixel can be addressed separately. Full colour active matrix displays require a light-emissive region comprising discrete pixels of three different light-emissive materials which are respectively capable of emitting light in the three primary colour regions.

One method of providing a patterned organic light-emissive region involves the use of ink-jet printing. However, the degree of pixel density which can be achieved by ink-jet printing is severely limited. Furthermore, the droplets formed by ink-jet printing are hemispherically shaped leading to non-uniform illumination within each pixel. In addition, it is an expensive process particularly when used to produce large area displays.

According to a first aspect of the present invention, there is provided a method for forming a patterned layer of a light-emissive material on a substrate, comprising the steps of providing a holed layer on the surface of the substrate, the holed layer being permanently attached to the substrate and defining a plurality of holes through which the underlying substrate is exposed; and applying a light-emissive material to the surface of the holed layer opposite the substrate and displacing the light-emissive material in fluid form across the surface of the holed layer so as to selectively deposit the material only in the holes of the holed layer.

The method of the present invention can be used to form any patterned layer such as a series of parallel rows or columns, a two-dimensional array of discrete pixels, or a layer in the shape of a legend comprising, for example, one or more letters or numerals or other shapes.

According to the present invention, the light-emissive material is displaced across the surface of the holed layer such that it is selectively deposited in the holes of the holed layer, i.e. such that it is deposited in the holes of the holed layer without substantially any deposition of the light-emissive material on the surface of the holed layer. Furthermore, the holed layer is permanently adhered to the substrate, i.e. the holed layer is not intended to be subsequently removed from the substrate. Indeed, the holed layer may be integral with the substrate.

The light-emissive material is preferably an organic light-emissive material. The term organic light-emissive material includes precursors of organic light-emissive materials, the precursors not necessarily being light-emissive themselves. For example, the organic light-emissive material may be a semi-conductive conjugated polymer or a precursor of a semi-conductive conjugated polymer.

The holed layer is preferably made of a polymer which is electrically non-conductive, and does not chemically react with the light-emissive material in a way which renders the light-emissive material non light-emissive. The holed layer may be opaque or transparent.

The holed layer is preferably made of a relatively benign polymer such as a fluorinated polymer. Examples of suitable fluorinated polymers include amorphous polytetrafluoroethylene (PTFE) or an amorphous ethylene-tetrafluoroethylene copolymer (ETFE), with amorphous PTFE being particularly suitable. The use of fluorinated polymers is advantageous because they do not react and swell upon contact with the standard solvents such as xylene and water which are typically used for forming solutions of organic light-emissive materials.

The holed layer is preferably formed by providing a layer of a polymer on the substrate, and then forming a plurality of holes in the polymer layer by etching. The etching is preferably carried out by a reactive ion etching process using an oxygen-based plasma. The polymer layer may be provided on the substrate by deposition using a standard technique such as spin-coating or blade-coating, or by laminating a pre-formed polymer layer to the substrate.

Alternatively, a polymer layer with pre-formed holes could be prepared in advance and then laminated to the substrate.

The thickness of the holed layer will clearly depend on the desired thickness of the patterned layer of light-emissive material, since its thickness will determine the thickness of the patterned layer of light-emissive material. For a typical organic light-emissive device, the fluorinated polymer layer is deposited to a thickness in the range of 50 to 100 nm.

The light-emissive material is preferably applied to the surface of the holed layer as a solution thereof in a suitable solvent.

Insoluble materials can be applied, for example, as a suspension thereof in a suitable liquid medium or in molten form.

According to a second aspect of the present invention, there is provided a method for forming an optoelectronic device comprising the steps of providing a substrate having a patterned first electrode on a surface thereof, providing a holed layer ion the surface of the substrate having the first patterned electrode, the holed layer being permanently attached to the substrate and defining a first set of holes through which the pattered first electrode is exposed, applying a first light-emissive material to the surface of the holed layer opposite the substrate, and displacing the first light-emissive material in fluid form across the surface of the holed layer so as to selectively deposit the material only in the first set of holes of the holed layer, solidifying the first light-emissive material, and forming a second electrode on the solidified first light-emissive material in the first set of holes such that charge carriers can move between the first light-emissive material and the second electrode.

The light-emissive material can be deposited directly on the underlying patterned first electrode. Alternatively, intermediate layers such as charge transport layers or additional light-emissive layers can be provided between the patterned first electrode and the light-emissive material provided that they allow the movement of charge carriers between the patterned first electrode and the light-emissive material. In a preferred embodiment, a layer of a hole-injection material is provided between the patterned first electrode and the light-emissive layer to promote the injection of holes from the patterned first electrode into the light-emissive material.

Likewise, the second electrode can be formed directly on the layer of light-emissive material, or intermediate layers such as charge transport layers or additional layers of light-emissive material can be interposed between the layer of light-emissive material and the second electrode, provided that they allow the movement of charge carriers between the second electrode and the layer of light-emissive material.

The light-emissive material is preferably an organic light-emissive material such as a semi-conductive conjugated polymer. The term conjugated polymer includes polymers and oligomers which are conjugated along the entire length thereof, and polymers and oligomers which comprise conjugated segments separated by non-conjugated segments.

The holed layer is preferably formed by depositing a layer of a polymer on the substrate and then forming the plurality of holes in the polymer layer after deposition of the holed layer. The plurality of holes are preferably formed by etching of the polymer layer, such as anisotropic reactive ion etching.

A patterned array of one or more holes of the desired shape may be achieved by a photolithographic technique. Such a technique involves forming a layer of a photoresist on the surface of the polymer layer; exposing the whole area of the photoresist (for example, using a shadow mask) to radiation; removing the portions of the photoresist layer by the use of a suitable developer to leave a photoresist layer having one or more holes of the desired shape formed therein which expose the portions of the underlying polymer layer in which holes are to be formed. Subsequent exposure to an etching plasma will only etch the portions of the polymer layer left exposed by the holes in the photoresist layer.

The etching is preferably carried out using a plasma which not only serves to etch the material of the holed layer but also serves to treat and prepare the exposed surface of the patterned first electrode for deposition of subsequent layers.

Embodiments of the present invention will be described hereunder, by way of example only, with reference to the accompanying drawings, in which:

FIGS. 1(a) to 1(h) are schematical cross-sectional views of a single colour organic light-emissive device at various stages of its production according to a first embodiment of the present invention.

FIGS. 2(a) to 2(h) are schematical cross-sectional views of a full colour organic light-emissive device at various stages of its production according to a second embodiment of the present invention.

Figure 3:
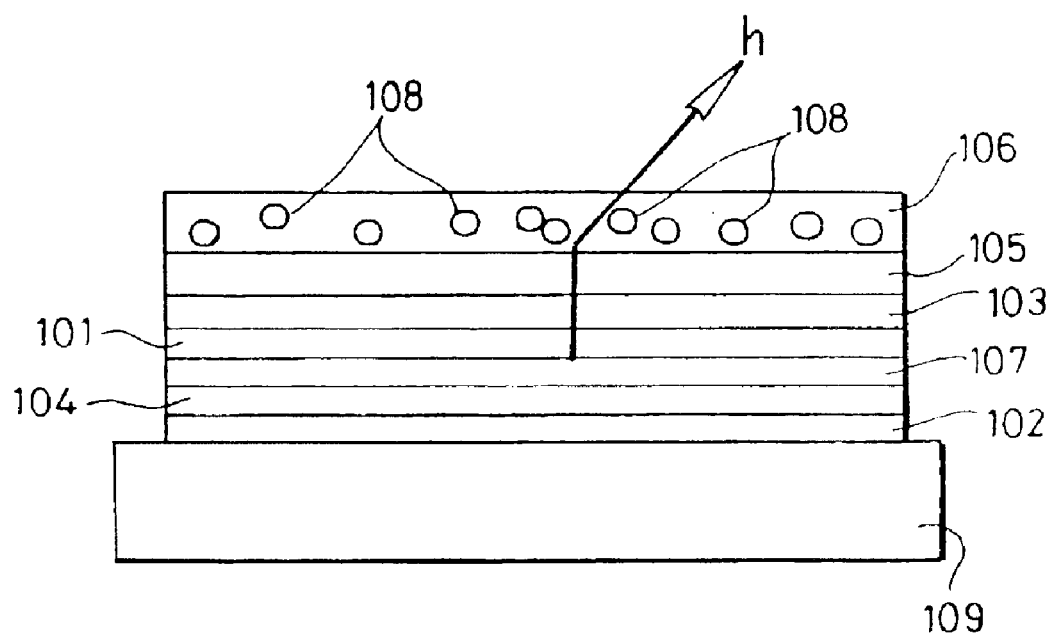

FIG. 3 shows an organic light-emissive device incorporating a resonant cavity structure and a light-dispersal structure.

First, with reference to FIGS. 1(a) to 1(h), a method of producing an organic light-emissive device according to a first embodiment of the present invention will be described.

A layer of a fluorinated polymer 6 such as amorphous polytetrafluoroethylene (PTFE) is formed over the surface of a substrate comprising a glass base 2 having a two-dimensional ordered array of anode pixels 4 made of indium tin oxide (ITO) formed on a surface thereof. In this embodiment, the substrate is made of glass, but it can also be made of other materials such as plastics eg PMMA. Wiring (which is not shown in the Figures) is connected from the periphery of the glass base to each anode pixel so that each anode pixel can be separately addressed in the final device.

The two-dimensional array of anode pixels 4 can be formed on a glass base 2 according to a conventional method such as sputtering using a shadow mask. The layer of fluorinated polymer is formed by a conventional coating method such as spin-coating using a solution of the fluorinated polymer in a suitable organic solvent and then drying.

The thickness of the layer of the fluorinated polymer layer will determine the thickness of the organic light-emissive region in the final device. For a typical organic light-emissive device, the fluorinated polymer layer is deposited to a thickness in the range of 50 to 100 nm.

Holes 8 are then created in the fluorinated polymer layer 6 to expose portions of the underlying anode pixels 4. The holes 8 are created by the following process. The surface of the fluorinated polymer layer is provided with an appropriately patterned photopolymer layer such as a photoresist on its upper surface by a standard photolithographical technique. The use of projection lithography to produce the patterned photopolymer layer can give affordable and high throughput processing.

Etching of the regions of the fluorinated polymer layer 6 left exposed by the photoresist is then carried out by a plasma etching process using an oxygen-based chemistry to form vertical holes in the fluorinated polymer layer 6 which extend down to the surface of the anode pixels 8. Each anode pixel 4 serves as an etch-stop. Once etching is completed the photoresist is stripped from the surface of the holed layer 6. The oxygen plasma also serves to treat the surface of the ITO anode pixels 4 for subsequent deposition of organic layers.

Although an oxygen plasma is used in this embodiment, other gases such as freons and sulphur hexafluoride can be used to carry out the etching process, with or without dilutions of oxygen. Alternatively, argon could be used where selectivity is not a requirement.

The exposed surface of the ITO anode pixels is then cleaned. Once the surface is cleaned, another short oxygen plasma treatment may be required to recover the treated ITO surface.

Next, a solution 12 of polystyrene sulphonic acid doped polyethylene dioxythiophene ("PEDOT-PSS") in water is applied to the surface of the holed polymer layer 6 and is wiped across the surface of the holed polymer layer 6 using a push rod 10, whereby the PEDOT-PSS solution 12 becomes deposited in the holes 8 to completely fill the holes 8 without substantially any deposition of the PEDOT-PSS solution on the top surface of the holed layer 6. The PEDOT-PSS solution 12 in the holes 8 is then dried to leave PEDOT-PSS pixels 14 in the holes 8. The PEDOT-PSS pixels only partially fill the holes 8 as a consequence of the reduction in volume associated with the evaporation of the aqueous solvent.

The thickness of the PEDOT-PSS pixels can be controlled by adjusting the concentration of the PEDOT-PSS solution. The thickness of the PEDOT-PSS pixels may be reduced by using a more dilute solution, and may be increased by using a more concentrated solution.

The use of a fluorinated polymer for the holed layer 6 is advantageous in this embodiment because it does not react and swell upon contact with the aqueous solvent.

The PEDOT-PSS provides a hole-injection layer which promotes injection of positive charge carriers into the light-emissive material to be subsequently deposited. Other materials which provide this hole-injecting function can also be used such as poly(2,7-(9,9-di-n-octylfluorene)-(1,4-phenylene-(4-imino(benzoic acid))-1,4-phenylene-(4-imino (benzoic acid))-1,4-phenylene)) ("BFA"), polyaniline and poly(p-phenylenevinylene) ("PPV").

Next, a solution 16 of an organic light-emissive material such as a semi-conductive conjugated polymer is applied to the surface of the holed layer 6 and is wiped across the surface of the holed layer 6 using a push rod 10 whereby it is selectively deposited in the holes 8 in the holed layer 6 on top of the PEDOT-PSS pixels 14, again to completely fill the holes without substantially any depostion of the organic light-emissive material on the top surface of the holed layer 6. The solution of the organic light-emissive material 16 left deposited in the holes 8 of the holed layer 6 is then dried to leave each hole containing an underlying layer 14 of PEDOT-PSS and an overlying layer of the organic light-emissive material. The selective deposition technique described above constrains the amount of material in fluid form deposited at each location to the available volume of the corresponding hole in the holed layer. This in turn is determined by the dimensions of the hole, which can be accurately controlled: the hole depth by the thickness of the holed layer 6, the dimensions in the plane of the layer by the photolithographic etching process. The above technique therefore allows the amount of fluid deposited at each location to be accurately controlled and, when used in combination with a fluid of carefully controlled concentration, allows the thickness of the resulting solid film to be accurately controlled. As is known, film thickness can be critical for the efficiency of organic electroluminescent devices.

The organic light-emissive material may comprise one or more individual organic materials, suitably polymers, preferably fully or partially conjugated polymers. Suitable materials include one or more of the following in any combination: poly(p-phenylenevinylene) ("PPV"), poly(2-methoxy-5(2'-ethyl)hexyloxyphenylenevinylene) ("MEH-PPV"), one or more PPV-derivatives (e.g. di-alkoxy or di-alkyl derivatives), polyfluorenes and/or co-polymers incorporating polyfluorene segments, PPVs and related co-polymers, poly(2,7-(9,9-di-n-octylfluorene)-(1,4-phenylene-((4-secbutylphenyl)imino)-1,4-phenylene)) ("TFB"), poly(2,7-(9,9-di-n-octylfluorene)-(1,4-phenylene-((4-methylphenyl)imino)-1,4-phenylene-((4 methylphenyl)imino)-1,4-phenylene)) ("PFM"), poly(2,7-(9,9-di-n-octylfluorene)-(1, 4-phenylene-((4-methoxyphenyl)imino)-1,4-phenylene-((4-methoxyphenyl)imino)-1,4-phenylene)) ("PFMO"), poly (2,7-(9,9-di-n-octylfluorene) ("F8") or (2,7-(9,9-di-n-octylfluorene)-3,6-Benzothiadiazole) ("F8BT"). Alternative materials include small molecule materials such as Alq3.

A typical solvent for forming solutions of the above materials is xylene. Other suitable solvents are THF, trichloromethane, toluene and other aromatic solvents. When these are used as the solvent, the use of a fluorinated polymer for the holed layer is advantageous because it does not swell upon contact with them.

A cathode 20 is then deposited over the surface of the light-emissive pixels 18 and the surface of the holed layer 6. The cathode preferably has a double layer construction with a thin underlying layer of a reactive metal such as calcium deposited on top of the light-emissive pixels 18 and a thick layer of a non-reactive metal such as aluminium deposited on top of the thin layer of reactive metal. The cathode is preferably deposited by evaporation to reduce to a minimum any damage to the underlying organic layers.

The matrix of polymer material surrounding each organic pixel and each anode pixel remains in the final device, and further serves to both electrically insulate the organic pixels and anode pixels from the influence of adjacent organic pixels and anode pixels. It also serves to physically protect and give structural support to the organic pixels and anode pixels.

Next, with reference to FIGS. 2(a) to 2(h), a method of producing a full colour organic light-emitting device according to a second embodiment of the present invention will be described.

A layer 54 of a fluorinated polymer is formed on a substrate comprising a glass base 50 having a two-dimensional array of anode pixels 52 made of ITO deposited thereon. The fluorinated polymer layer 54 may be formed, for example, by the method described for the first embodiment.

A first set of holes 56 are then formed at selected points of the fluorinated polymer layer 54 in the same way as in the first embodiment, to expose only some of the anode pixels 52. For example, the two dimensional array of anode pixels may comprise an array of groups of three associated pixels, with the first set of holes 56 being formed to expose only a single one of the three anode pixels in each group.

A layer of an organic hole-injection material and a layer of a first organic light-emissive material are then deposited in each hole 56 in the same manner as in the first embodiment to create an array of organic pixels 58. A cathode 60 is then formed over the whole surface of the holed layer 52 and the organic pixels 58. As in the first embodiment, the cathode preferably has a double layer construction with an underlying first thin layer of a reactive metal such as calcium and an overlying thick layer of a non-reactive metal such as aluminium.

The cathode metallization serves to protect the organic pixels 58 embedded into the fluorinated polymer from subsequent processing steps.

Next, a second set of holes 62 is formed to expose some of the anode pixels 52 which were not exposed in the previous hole-forming step. For example, in the array described above, the second set of holes could be formed to only expose a second one of the three anode pixels in each group. This second set of holes 62 can be formed in the same manner as the first set of holes, except that different plasma chemistries may be needed, one to punch through the cathode 60 and one to etch through the fluorinated polymer layer 54. Fluorocarbons, sulphur hexafluoride, argon, methane/hydrogen and chlorine chemistries such as boron trichloride are examples of materials which can be used to punch through the cathode. The etching through of the cathode can be observed by optical absorption in the plasma chamber used. The etching of the fluorinated polymer layer 54 is carried out using an oxygen-based plasma as in the first embodiment.

A second set of organic pixels 64 is then formed in the second set of holes 62 in the same manner as in the first embodiment. Although, not shown in the Figures, each of the second set of organic pixels 64 also comprises an underlying layer of PEDOT-PSS (as a hole injection layer) and an overlying layer of an organic light-emissive organic material which is capable of emitting light of a primary colour different to that of the light-emissive material deposited in the first set of holes 56.

Another cathode 66 is then deposited over the second set of organic pixels 64 to protect the second set of organic pixels 58 from subsequent processing steps.

Next, a third set of holes 68 is formed through the cathodes 60,66 and the fluorinated polymer layer 54 to expose the remaining anode pixels which were not exposed in the previous first and second hole forming steps. For example, in the array described above, the third set of holes could be formed to only expose the third and final anode pixel of each group of three associated anode pixels. The third set of holes 68 can be formed in the same manner as the second set of holes 62. A third set of organic pixels 7C is then deposited in the third set of holes 68 in the same manner as in the first embodiment. Although not shown in the Figures, the third set of organic pixels 68 also each comprise an underlying layer of PEDOT-PSS as a hole-injection layer and an overlying layer of an organic light-emissive material which is capable of emitting light of a primary colour different from the light-emissive materials deposited in the first and second sets of holes 56, 62.

In both the above-described embodiments, the fact that the shape and size of the organic pixels are defined by holes which are created by etching means that pixels of uniform shapes and of very small dimensions (of the order of a number of microns) can be formed because of the high precision of the etching process, and the pixel density can therefore be increased significantly compared to arrays of organic pixels produced by conventional methods such as ink-jet printing.

Furthermore, this method can be used to produce pixels having a uniform rectangular shape i.e. having a depth greater than their length or width. This gives good colour uniformity across the individual pixel area.

Furthermore, the above-described method of deposition of the organic materials is an extremely cost-effective deposition method which is particularly significant in the production of large area displays.

A final advantage of the above-described method is its ability to accurately meter the amount of fluid material deposited and thereby control the thickness of the resultant dried film, this being important for device efficiency.

FIG. 3 shows a light-emitting device comprising: a pair of electrodes; a light emitting region located between the electrodes and comprising light-emitting organic material; a first reflective layer and a second reflective layer, the second reflective layer being partially transmissive and the first and second reflective layers being located on either side of the light-emitting region to define a resonant cavity structure about the light-emitting region; and a light-dispersal structure outside the cavity for dispersing light emitted from the cavity through the second reflective layer.

The OLED of FIG. 3 includes a region 101 of light emitting material. An anode electrode 102 and a cathode electrode 103 are located on either side of the light-emitting material. A resonant cavity reflector structure is defined about the light-emitting region 101 by a reflective layer 104 and a partially reflective and partially light-transmissive layer 105. The resonant structure is capable of enhancing emission from the light-emitting region and/or narrowing the emission spectrum from the region. On the outside of the partially light-transmissive layer is a structure 106 that is capable of dispersing the light emitted from the cavity so as to render the far-field emission from the overall device more Lambertian.

The resonant structure of the device constitutes a planar microcavity. The resonance wavelengths, $\lambda_{Rec}$, of the cavity are determined by the effective length, $L_{eff}$, of the cavity. The effective length of the cavity is a function of the refractive index and the thickness of each of the layers in the cavity and the phase change on reflection of light from the mirrors. If the refractive index of the κth layer of the cavity is $n_k$ and the thickness of the κth layer of material is $d_k$ then the effective length of the cavity is given by:

$$L_{eff} = L_{phase\_change} + \sum_k n_k \cdot d_k$$

and the resonance wavelengths are given by:

$$\lambda_{Res} = \frac{2L_{eff}}{q}$$

where q is an integer.

The electroluminescent device of FIG. 3 is formed on a glass substrate 109 which is coated with an anode electrode layer 102 of indium-tin oxide (ITO). Such ITO-coasted glass substrates are commercially available. The glass sheet could be a sheet of sodalime or borsilicate glass of a thickness of, for instance 1 mm. Instead of glass other materials such as Perspex could be used. The thickness of the ITO-coating is suitably around 150 nm and the ITO suitably has a sheet resistance of between 10 and 30 Ω/, preferably around 15 Ω/. Instead of ITO other materials, preferably of relatively high work function, such as tin oxide (TO) could be used.

A distributed Bragg reflector (DBR) consists of a stack of regularly alternating higher- and lover-refractive index dielectrics (light transmissive materials) fabricated to fulfil the Bragg condition for reflection at particular wavelengths. This occurs when the optical path of the periodicity in the dielectric stack corresponds to half a wavelength, and the reflectivity is further optimised when the DBR stack obeys the following condition:

$$\tfrac{1}{2}\lambda = n_1 d_1 + n_2 d_2$$

where $n_1$, $n_2$ are the respective refractive indices; $d_1$, $d_2$ are the corresponding component film thicknesses in the DBR; and $\lambda$ is the desired reflection wavelength.

The reflective layer 104 is formed over the ITO layer 102. The reflective layer 104 is formed as a distributed Bragg reflector structure formed of alternating layers of conductive or semiconductive materials such as partially doped PPV or other conjugated polymers (see our co-pending UK patent application number 9907802.4, the contents of which are incorporated herein by reference) or GaAs and AlGaAs. The layer thicknesses are chosen so that the structure is capable of reflecting light at a selected emission frequency of the emissive region. Instead of the reflective layer 104 being formed between the electrode 102 and the light-emitting layer 101 the electrode 102 could be formed between the light-emitting layer 101 and the reflective layer. In that case the reflective layer would not have to be electrically conductive, but the electrode 102 should be light-transmissive, as is ITO, for instance. Another alternative is for the reflective structure to be formed over only parts of the ITO layer—in that case the reflector could be electrically insulating but conduction from the ITO to the emissive layer is possible in the regions not covered by the reflective layer. Suitable materials for an electrically insulating DBR include Si and $SiO_2$. A further alternative is to form the ITO layer 102 to a thickness of a quarter of the (or a desired) emission wavelength of the light-emitting material, so it acts as at least a partial DBR structure—the separate reflective structure could then be omitted.

In the device of FIG. 3 a charge transport layer 107 is formed over the reflective layer 104. The charge transport layer improves hole transport between the anode and/or reflective structure 104 and the light-emitting region 101. The charge transport layer is formed of PEDOT:PSS. The charge transport layer could be formed from a solution containing PEDOT:PSS with a ratio of PEDOT to PSS of around 1 to 5. The hole transport layer could be spin-coated from solution and then baked e.g. at 200° C. for 1 hour in a nitrogen environment. The thickness of the transport layer is suitably around 50 nm but the thickness may be chosen so as to set the width of the resonant cavity to a desired value whilst allowing the thicknesses of the other layers of the device to be optimised for other factors. Instead of PEDOT:PSS other conductive materials such a polyaniline could be used for the charge transport layer 107. Alternatively the charge transport layer could be omitted and the thickness of other layers of the device could be chosen so as to fix the width of the cavity.

Then the light emitting layer 101 is deposited. The light-emitting layer could be formed of any suitable organic light-emitting material, but polymer materials are preferred. For example, an electroluminescent layer comprising 20% TFB in 5BTF8 could be coated over the hole transport layer by spin-coating typically to a thickness of 90 nm. The term 5BTF8 refers to poly (2,7-(9,9-di-n-octylfluorene) ("F8") doped with 5% poly-(2,7-(9,9-di-n-octylfluorene)-3,6-benzothiadiazole) ("F8BT").

The cathode electrode layer 103 is formed over the light-emitting layer 101. The cathode electrode layer is formed of LiF with a thickness of 0.5 to 10 nm, formed by evaporation of LiF. Such a layer is light-transmissive, so that light can pass through it to leave the device. In the device of FIG. 3 the reflector 104 is fully reflective and emission is from the upper surface of the device as illustrated Therefore the cathode is formed of a light-transmissive material. If the reflector 104 were partially reflective and emission from the lower surface of the device, the cathode could be opaque and formed of e.g. thin layer of Ca covered with a protective layer of Al. It is preferred that the material of the cathode electrode, at least at the surface facing the light-emitting material, has a relatively low work function.

In this embodiment a further DBR structure 105 is formed over the cathode electrode. The structure 105 is formed as for structure 104, but with fewer layers so that the structure 105 is not fully reflective but is partially reflective and partially light transmissive. This allows some leakage from the cavity structure so that light can leave the device. A suitable form for the structure 105 is again alternating layers of differently doped conjugated polymer(s), alternating layers of GaAs/AlGaAs or alternating layers of Si/SiO$_2$. Since the structure 105 is not located between the electrodes it need not be electrically conductive or semiconductive but could be formed of alternating layers of insulating materials. Alternatively, the cathode layer 103 could be metallised so that is partially reflective and partially light-transmissive, so that there is no need for a separate reflective layer.

The light dispersal structure 106 is formed over the upper reflector of the cavity—i.e. outside (preferably immediately outside) the cavity in the viewing direction. In the embodiment of FIG. 3 the light-dispersal structure is formed by coating the device with a layer of light-transmissive polymer material containing a dispersal; of light-transmissive particles 108. The particles have a different refractive index from the polymer matrix, so light leaving the device is scattered as it passed through the structure. The particles could be fragments or spheres of glass or latex or nanoparticles of a material such as TiO$_2$ (see our co-pending UK patent application number 9815270.5, the contents of which are incorporated herein by reference). Suitable materials for the matrix include fluorinated polymers, polyimide, polyethylene or a photoresist material. The diameter of the particles could suitably be 0.1 to 0.5 times the selected emission wavelength of the device.

It may be preferred for the particles to have a size distribution across all or part of that range or outside it in order to lessen any wavelength dependence of the scattering- this may be useful if the device is to be a full-colour display. The thickness of the layer of matrix could be 10–5000 nm and the loading of the particles 10–60% by volume. The structure could be formed by spin-coating, spray coating, evaporation or lamination. The materials of the particles and the matrix should be chosen so that they have different refractive indices (so that scattering can occur in the structure) and also so that the refractive index of the matrix does not cause undesirable reflections at its interface with the adjacent underlaying layer.

Instead of containing solid particles, the matrix of the light dispersal structure could be formed so as to include bubbles for pockets of air that could similarly perform scattering of the emitted light.

Finally, contacts are made to the anode and cathode electrodes to allow the device to be driven, and the device is encapsulated, for example in epoxy, for environmental protection.

When the device is in use emitted light is scattered by the structure 106, which renders the far-field emission from the device more Lambertain. After scattering, the light is emitted in a range of directions from each point over the device's area. The range of directions is preferably greater than 90° and may preferably approach 180°.

The structure 106 could be formed outside, rather than inside the encapsulant. Forming the structure 106 atop the encapsulant may help to reduce the possibility of waveguiding in the device. If the encapsulant itself provides the scattering structure then it is especially preferable for the scattering to be by means of bubbles or voids (e.g. containing air or inert gas) in the encapsulant layer.

The structure 106 could be formed in many other ways. For example, the structure could be formed by a layer (for example of a polymer material such as fluorinated polymers, polyimide, polyethylene or a photoresist material) having surface relief on its upper surface (the surface further from the light-emitting region) so that it causes scattering of emitted light there. The surface relief could be formed by etching (e.g. plasma or wet etching) into the surface, either randomly or in a predetermined design, by stamping or scratching or in another way. The predetermined design could be chosen to promote Lambertian output. The upper surface could be uneven or rough, and could include a pattern of scratches, grooves, ridges or other surface irregularity which could be formed by scraping or stamping. The scale of the roughening is suitably in the size range that will cause efficient scattering of the light emitted from the cavity—e.g. in the range from 0.1 to 0.5 times the emission wavelength of the device.

In the embodiment of FIG. 3 the reflector 105 is partially reflective and the electrode 103 is light transmissive. In other devices the reflector 104 could be partially reflective and the electrode 102 light transmissive.

The electrodes could be reversed, so that the first electrode to be deposited is the cathode and the upper electrode the anode.

A charge transport layer could be provided between the emissive material the cathode to improve electron transport into the light-emitting region.

Either or both of the electrodes may be patterned so to allow individual regions of the display to be selectively addressed.

The particles could be opaque, provided that they were of a size that nevertheless inherently gave rise to suitable scattering effects or were fully or partially reflective. Although the present invention has been described above in respect of its application to the formation of an organic layer comprising an array of pixels, it will be appreciated by the person skilled in the art that the method of the present invention can be used to form other patterned layers such as layers comprising one or more parallel rows or columns, each column or row comprising the same light-emissive material or comprising light-emissive materials which emit light of different colours. Alternatively, the method of the present invention can be used to form layers in the shape of one or more legends such as ones comprising one or more numerals or letters or other shapes, each numeral, letter or other shape composing the legend comprising the same light-emissive material or comprising light-emissive materials which emit light of different colours.

What is claimed is:

1. A method for forming an optoelectronic device comprising the steps of:
   providing a substrate having a patterned first electrode on a surface thereof;
   providing a holed layer on the surface of the substrate having the first patterned electrode, the holed layer being permanently attached to the substrate and defining a first set of holes through which the patterned first electrode is exposed;
   applying a first light-emissive material to the surface of the holed layer opposite the substrate;
   displacing the first light-emissive material in fluid form across the surface of the holed layer so as to selectively deposit the material only in the first set of holes of the holed layer;
   solidifying the first light-emissive material; and
   forming a second electrode on the solidified first light-emissive material in the first set of holes such that charge carriers can move between the first light-emissive material and the second electrode.

2. A method for forming an optoelectronic device according to claim 1 comprising providing the holed layer by laminating a polymer layer with pre-formed holes to the surface of the substrate.

3. A method for forming an optoelectronic device according to claim 1 comprising depositing the second electrode without first removing the holed layer.

4. An optoelectronic device produced by the method of claim 1.

5. A method for forming an optoelectronic device according to claim 1 comprising providing the holed layer by providing a layer of a polymer on the surface of the substrate having the patterned first electrode, and then forming the first set of holes in the polymer layer.

6. A method for forming an optoelectronic device according to claim 5 comprising forming the first set of holes by etching.

7. A method according to claim 1 further comprising the step of forming a layer of a charge transport material in the first set of holes.

8. A method according to claim 7 comprising depositing the layer of charge transport material in the first set of holes by applying the charge transport material to the surface of the holed layer and displacing the charge transport material in a fluid form across the surface of the holed layer whereby the charge transport material is deposited in the first set of holes.

9. A method according to claim 1 further comprising the step of forming a layer of a hole injection material in the first set of holes between the patterned first electrode and the first light emitting material.

10. A method according to claim 9 comprising depositing the layer of hole injection material in the first set of holes by applying the hole injection material in a solvent to the surface of the holed layer and displacing the hole injection material in a fluid from across the surface of the holed layer whereby the hole injection material is deposited in the first set of holes.

11. The method according to claim 10 comprising evaporating the solvent prior to applying the first light-emissive layer.

12. A method for forming an optoelectronic device according to claim 1 wherein the patterned first electrode comprises a two-dimensional array of discrete pixel electrodes.

13. A method according to claim 12 wherein the first set of holes exposes only some of the discrete pixel electrodes.

14. A method according to claim 13 further comprising forming a second set of holes in the holed layer to expose discrete pixel electrodes which were not exposed by the first set of holes in the holed layer, depositing a layer of second light-emissive material in the second set of holes, and forming a third electrode on the layers of second light-emissive material such that charge carriers can move between the layers of second light-emissive material and the third electrode.

15. A method according to claim 14 comprising additionally forming the second electrode over substantially the entire surface of the holed layer opposite the substrate, and forming the second set of holes by etching through the second electrode and the holed layer.

16. A method according to claim 15 further comprising forming a third set of holes in the holed layer to expose further discrete pixel electrodes which were not exposed by the first or second sets of holes, depositing a layer of third light-emissive material in the third set of holes, and forming a fourth electrode on the layers of third light-emissive material such that charge carriers can move between the fourth electrode and the layers of third light-emissive material.

17. A method according to claim 16 wherein the first, second and third light-emissive materials are each capable of emitting light of the three primary colours respectively.

18. A method for forming an optoelectronic device according to claim 16 comprising forming the second, third and fourth electrodes without removing the holed layer.

* * * * *